(12) United States Patent
Simon

(10) Patent No.: US 12,256,498 B2
(45) Date of Patent: Mar. 18, 2025

(54) STORAGE DEVICE

(71) Applicant: OSRAM Opto Semiconductors GmbH, Regensburg (DE)

(72) Inventor: Ronny Simon, Teublitz (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 778 days.

(21) Appl. No.: 17/423,182

(22) PCT Filed: Jan. 13, 2020

(86) PCT No.: PCT/EP2020/050633
§ 371 (c)(1),
(2) Date: Jul. 15, 2021

(87) PCT Pub. No.: WO2020/148197
PCT Pub. Date: Jul. 23, 2020

(65) Prior Publication Data
US 2022/0078956 A1    Mar. 10, 2022

(30) Foreign Application Priority Data

Jan. 15, 2019  (DE) .......................... 102019100951.0

(51) Int. Cl.
*H05K 13/00* (2006.01)
*B65D 73/02* (2006.01)

(52) U.S. Cl.
CPC ......... *H05K 13/0084* (2013.01); *B65D 73/02* (2013.01)

(58) Field of Classification Search
CPC .............................. B65D 85/38; H05K 13/0084

USPC ......................................................... 206/449
See application file for complete search history.

(56) References Cited

U.S. PATENT DOCUMENTS

| | | | |
|---|---|---|---|
| 3,870,212 A * | 3/1975 | Polk ................... | B65H 35/0006 |
| | | | 225/80 |
| 5,098,114 A | 3/1992 | Jones | |
| 5,597,074 A | 1/1997 | Ko | |
| 5,738,219 A | 4/1998 | Arsena et al. | |
| 5,908,114 A | 6/1999 | Athouse et al. | |
| 6,813,828 B2 | 11/2004 | Dlugokecki et al. | |
| 8,220,630 B1 * | 7/2012 | Ku ............................ | G03F 1/66 |
| | | | 206/454 |
| 10,670,976 B2 * | 6/2020 | Hsueh ................. | G03F 7/70741 |
| 11,442,370 B2 * | 9/2022 | Chuang ............. | H01L 21/67376 |
| 11,569,108 B2 * | 1/2023 | Raga-Barone .... | H01L 21/67393 |

(Continued)

FOREIGN PATENT DOCUMENTS

| DE | 202010009472 U1 | 2/2011 |
|---|---|---|
| DE | 102011114309 A1 | 3/2013 |

(Continued)

*Primary Examiner* — Ernesto A Grano
(74) *Attorney, Agent, or Firm* — Slater Matsil, LLP

(57) ABSTRACT

In an embodiment a storage device includes a base carrier extending along a main surface having a surface structuring, a carrier foil including a first main surface and a second main surface, wherein the first main surface is fixable to or arrangeable on the main surface of the base carrier, and wherein the components are fixable to the second main surface and a fixing frame fixing the carrier foil, which is fixed or positioned to the main surface of the base carrier, to the base carrier and acting as a releasable clamp so that the carrier foil is clampable and securable in or to the base carrier.

16 Claims, 13 Drawing Sheets

(56) References Cited

U.S. PATENT DOCUMENTS

| | | | |
|---|---|---|---|
| 2004/0144687 A1 | 7/2004 | Sun | |
| 2010/0126891 A1* | 5/2010 | Schafer | B65D 75/225 |
| | | | 206/307 |
| 2010/0176013 A1 | 7/2010 | Nagai et al. | |
| 2013/0020220 A1* | 1/2013 | Kolbow | G03F 1/66 |
| | | | 206/454 |
| 2013/0118124 A1 | 5/2013 | Cheah et al. | |
| 2015/0041616 A1* | 2/2015 | Gentile | G06K 19/0723 |
| | | | 248/550 |
| 2017/0257990 A1* | 9/2017 | Ng | B65D 73/02 |
| 2017/0344864 A1* | 11/2017 | Forster | G06K 19/07786 |
| 2018/0110164 A1* | 4/2018 | Furutani | H05K 9/003 |
| 2020/0279785 A1* | 9/2020 | Faul | H01L 23/49838 |
| 2020/0279787 A1* | 9/2020 | Faul | H01L 24/13 |
| 2020/0279797 A1* | 9/2020 | Faul | H01L 23/49572 |
| 2020/0279801 A1* | 9/2020 | Yacoub-George | |
| | | | H01L 23/49833 |
| 2023/0070970 A1* | 3/2023 | Lee | B65G 49/06 |

FOREIGN PATENT DOCUMENTS

| | | |
|---|---|---|
| EP | 0484294 A1 | 5/1992 |
| EP | 0673193 A1 | 9/1995 |
| JP | 2015044613 A | 3/2015 |
| WO | 2015133293 A1 | 9/2015 |

* cited by examiner (State of the Art)

(State of the Art)

(State of the Art)

(State of the Art)

(State of the Art)

STORAGE DEVICE

This patent application is a national phase filing under section 371 of PCT/EP2020/050633, filed Jan. 13, 2020, which claims the priority of German patent application 102019100951.0, filed Jan. 15, 2019, each of which is incorporated herein by reference in its entirety.

TECHNICAL FIELD

The invention relates to a device for storing, in particular for transporting, components, in particular electronic components, in particular semiconductor components, in particular bars, and to the use thereof.

BACKGROUND

Semiconductor components must be placed on a carrier, in particular for transport, and removed therefrom. The components must be placed in a tray in such a way that they do not slip or fall off the carrier during transport. The components, in particular the facets of laser bars, must also be protected from contact of any kind. The semiconductors must not touch each other. When lifting the semiconductors from the carrier, the adhesive force of the carrier material must be reduced to such an extent that semiconductor bars can be removed non-destructively using, for example, vacuum tweezers. No residues, such as adhesive threads, must adhere to the component.

In particular, bars are pieces of metal, semi-metal or, in this case, semiconductor material cast in a mold for storage and/or transport.

U.S. Pat. No. 6,813,828 B2 and U.S. Pat. No. 5,908,114 disclose conventional devices for transporting semiconductor components, as well as their uses under the designation gel pack. In order to remove a bar from a conventional gel pack, a vacuum must be created in the gel pack. This causes the gel film to wrap around the nylon filaments, greatly reducing the area of contact between the gel and the bar. The adhesion of the bar to the carrier is thus reduced. The bar can be lifted off. Laser bars can be delivered to the customer in gel packs. An average of 15 gel packs can be used per batch. However, these devices and uses are expensive. The gel packs consist of a printed base carrier or an injection molded part, where one material used can be polycarbonate. Other components include a net provided as a nylon mesh, a gel film, and a cover created as an injection molded part.

SUMMARY

Embodiments provide a storage device, in particular for a transport, of components, in particular semiconductor components, wherein the components are deposited on a carrier and removed therefrom. The components must be deposited on a carrier in such a way that they do not slip or fall off the carrier, in particular during transport. The components, in particular the facets of laser bars, must also be protected from contact of any kind. The semiconductors must not touch each other. When the semiconductors are lifted from the carrier, it must be possible to reduce the adhesive force of the carrier material in such a way that semiconductor bars can be removed non-destructively, for example with vacuum tweezers. No residues, such as adhesive threads, must adhere to the component. The storage device should be inexpensive and robust. Transport should be safe.

According to a first aspect, a storage device for components, in particular semiconductor components, in particular bars, is proposed, comprising:
  a base carrier extending along a plane or X-Y plane, comprising a surface structuring on one main surface side;
  a carrier foil, one main surface of which is fixable to the main surface of the base carrier comprising the surface structuring, and to the other main surface of which the components are fixable.

According to a further aspect, a storage device for components, in particular semiconductor components, in particular bars, is proposed, comprising:
  a base carrier extending along a surface, in particular an X-Y plane, which comprises a surface structuring on one main surface side;
  a carrier foil, one main surface of which can be positioned against the main surface of the base carrier comprising the surface structuring, and to the other main surface of which the components can be fixed;
  a fixing frame which fixes the carrier foil positioned on the main surface of the base carrier comprising the surface structuring to the base carrier.

According to a further aspect, the use of a storage device for components, in particular semiconductor components, in particular bars, is proposed, wherein a depositing or fixing of the components to the carrier foil is carried out by means of adhesion and/or adhesive means; a fixing or clamping of the carrier foil carrying components to the base carrier is carried out by means of adhesion and/or adhesive means and/or by means of a fixing frame; a removal of the components from the carrier foil is carried out by applying a vacuum or negative pressure to the carrier foil carried by the base carrier.

According to one embodiment, a fixing frame may be provided which additionally fixes the carrier foil fixed to the main surface of the base carrier comprising the surface structuring to the base carrier.

According to a further embodiment, a cover extending along a surface, in particular an X-Y plane, and closing the carrier foil fixed to the base carrier from the side of the carrier foil may be provided.

According to a further embodiment, a closure which extends along a surface, in particular an X-Y plane, and closes off the carrier foil fixed to the base carrier from the side of the base carrier may be provided.

According to a further embodiment, the cover and closure can extend along a surface, in particular the X-Y plane, beyond the carrier foil fixed to the base carrier by means of the fixing frame.

According to a further embodiment, in closed state the cover together with the closure can in a fixing manner completely enclose the carrier foil fixed to the base carrier by means of the fixing frame.

According to a further embodiment, the surface structuring of the base carrier can comprise elongated recesses, in particular grooves or riffles, adapted for the removal of the components, in particular bars.

According to a further embodiment, the main surface of the base carrier can comprise a rectangular or square surrounding wall along the surface, in particular the X-Y plane, within which elongated recesses, in particular grooves or riffles, are formed running diagonally to the latter.

According to a further embodiment, the elongated recesses, in particular grooves or riffles, can comprise regular interruptions or passages, in particular for providing negative pressure or a vacuum between the carrier foil and the base carrier.

According to a further embodiment, the base carrier may be manufactured by means of an injection molding process, in particular aluminium injection molding.

According to a further embodiment, the carrier foil may be an adhesive foil and/or comprise at least one adhesive agent on at least one of the main surfaces.

According to a further embodiment, the carrier foil may comprise a material stiffness and/or thickness, in particular from 0.05 to 2 mm, such that it is not destroyed when fixed to the base carrier by means of the fixing frame.

According to a further embodiment, the fixing frame can act as a releasable clamp and thus clamp and secure the carrier foil in or to the base carrier.

According to a further embodiment, the fixing frame can be clampable to the base carrier by means of a groove formed on the base carrier.

According to a further embodiment, the fixing frame can be clampable to the base carrier by means of conically formed flanks on the base carrier.

According to a further embodiment, the fixing frame can be clampable to the base carrier by means of securing pins formed on the base carrier.

According to a further embodiment, the base carrier, the carrier foil, the fixing frame, the cover and the closure can be made of conductive polycarbonate material.

According to a further embodiment, the base carrier, the carrier foil, the fixing frame, the cover and the closure may be manufactured by sintering and/or 3D printing or injection molding.

According to a further embodiment, after fixing the component-carrying carrier foil to the base carrier, if appropriate by means of the fixing frame, its complete enclosure can be affected by means of the cover and the closure.

According to a further embodiment, before the components are removed from the carrier foil carried by the base carrier, the cover and the closure can be removed by applying a vacuum or negative pressure to the carrier foil carried by the base carrier.

BRIEF DESCRIPTION OF THE DRAWINGS

The invention is described in more detail by means of examples in connection with the figures.

DETAILED DESCRIPTION OF ILLUSTRATIVE EMBODIMENTS

Figure 1A:
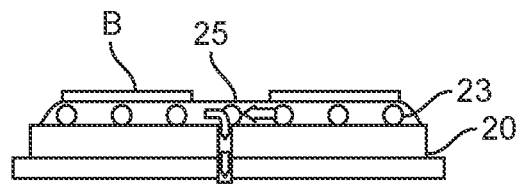
FIG. 1A shows an illustration of a conventional device and a first step of its use.
Figure 1B:
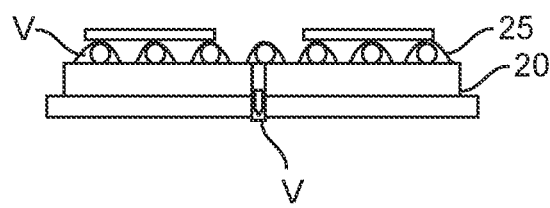
FIG. 1B shows an illustration of a conventional device and a second step of its use.
Figure 1C:
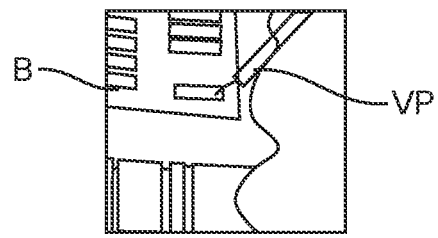
FIG. 1C shows an illustration of a conventional device and a third step of its use.
Figure 2:
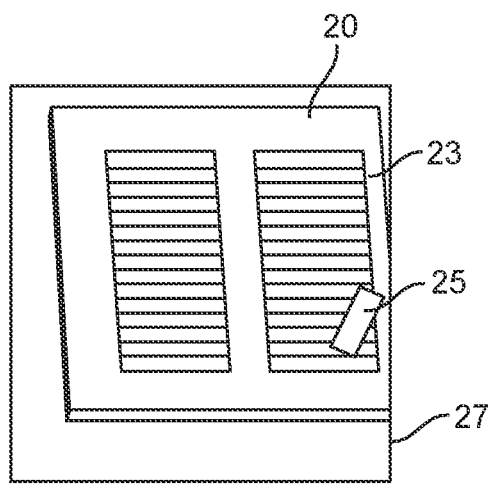
FIG. 2 shows a further illustration of a conventional device with individual parts stacked on top of each other.
Figure 3:
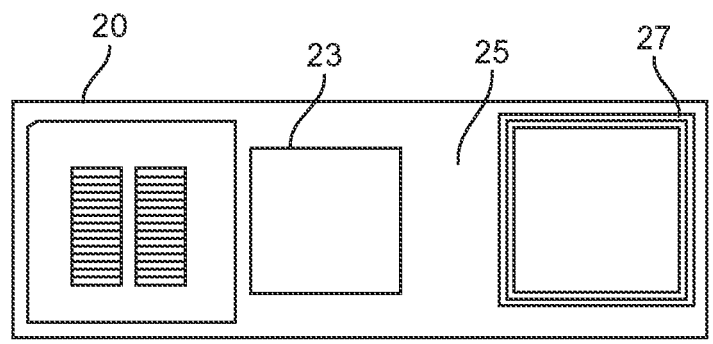
FIG. 3 shows a further illustration of a conventional device with individual parts separated from each another.

FIGS. 1A to 1C show an illustration of a conventional use of a conventional device. A device according to the present invention can be used in a similar manner. FIGS. 2 and 3 show a conventional device.

FIG. 1A shows a first step of using a conventional device. In this first step, bars B are deposited on a gel film 25. Below the gel film 25, a nylon grid 23 is formed, which is mounted on a base carrier 21. The bars B are deposited in the storage device in such a way that they cannot slip or fall off the base carrier 21 during transport. FIG. 1A shows the device in the state in which no negative pressure or vacuum has yet been built up between gel 25 and base carrier 21. The base carrier 21 has a passage to the area below the gel 25. Through this passage, the air can be pumped out between the bar B or the gel 25 and the base carrier 21. In this way, a negative pressure or vacuum is created which attracts the gel film 25 towards the base carrier 21 such that contact areas between a bar B and the gel film 25 are effectively reduced.

FIG. 1B shows another illustration of the conventional device, during a second step of using the conventional device. FIG. 1B corresponds to FIG. 1A, but with the difference that now negative pressure is built up or a vacuum V is generated in the space between the gel film 25 and the base carrier 21 in such a way that the gel film 25 nestles against the nylon grid 23. At this stage, the vacuum V reduces the contact areas between the bars B and the gel film 25. In this way, the bars B are now prepared for lifting. The adhesive force of the carrier material, which in this case is the gel film 25, has thus been effectively reduced.

FIG. 1C shows a further illustration of a conventional device and a third step of the use of the conventional device. FIG. 1C shows a top view which follows the condition according to FIG. 1B. Since a vacuum V is now applied, the semiconductors or bars B can be lifted off in a simple manner, for example by means of vacuum tweezers VP in a non-destructive manner.

FIG. 2 shows a further illustration of a conventional device. According to the illustration in FIG. 2, a conventional device for storage is shown as individual parts stacked on top of one another. A nylon grid 23 is positioned on a base carrier 21, over which a gel film 25 is provided. The stack is closed from above by means of a transparent cover 27.

FIG. 3 shows a further illustration of a conventional device. According to FIG. 3, in contrast to FIG. 2, the individual parts are shown separately from one another. In FIG. 2, the individual parts are stacked on top of each other. Reference sign 21 indicates a base carrier. Reference sign 23 indicates a nylon grid, reference sign 25 refers to a gel film and reference sign 27 indicates a cover.

Figure 4A:
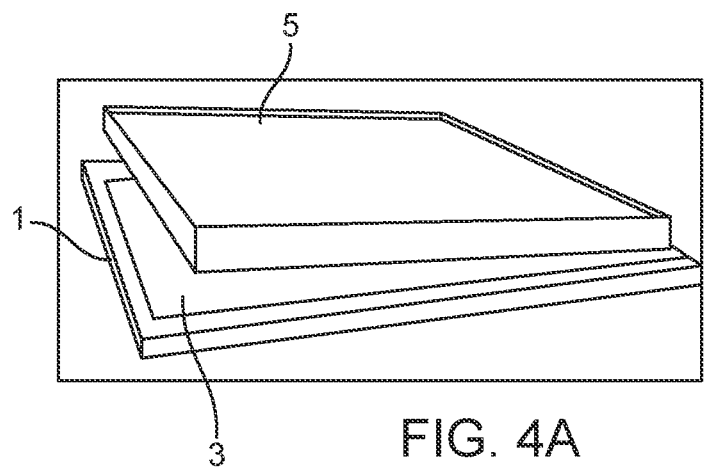
FIG. 4A shows an illustration of a device according to the invention with individual parts stacked on top of each other.

FIG. 4A shows an illustration of a device according to the invention. The illustration according to FIG. 4A shows the device according to the invention as individual parts layered on top of each other. FIG. 4A shows a base carrier 1, on which a carrier foil 3 is arranged, which can be fixed by means of a fixing frame 5.

Figure 4B:
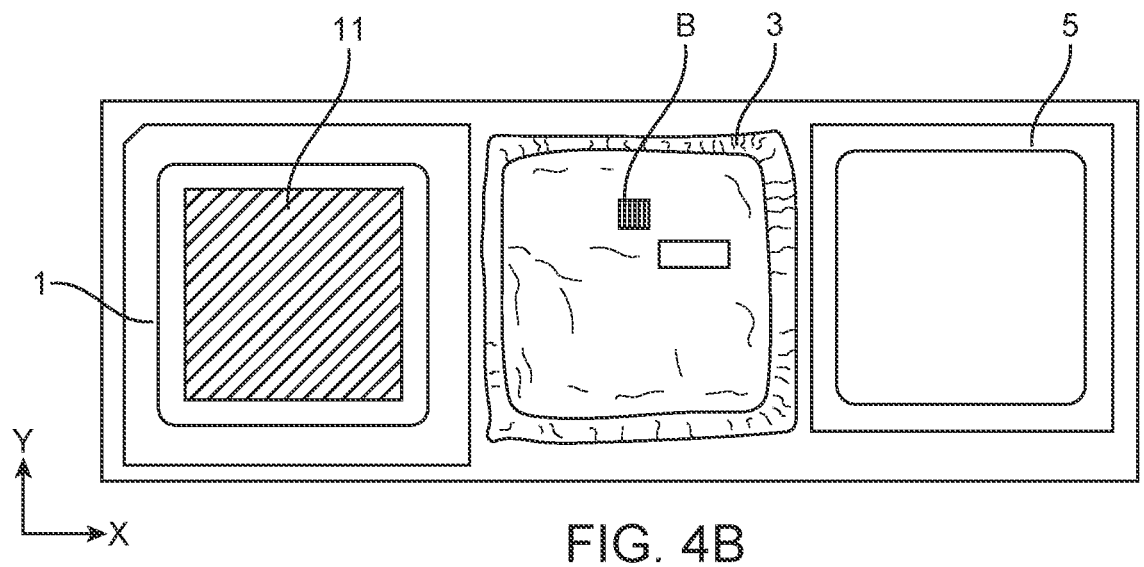
FIG. 4B shows an illustration of a device according to the invention with individual parts separated from each another.

FIG. 4B shows a further illustration of a device according to the invention, in this case with individual parts separated from one another. FIG. 4B shows individual parts of the storage device according to the invention, which is to be used for components, in particular for semiconductor components, in particular in the form of bars. Reference sign 1 indicates a base carrier 1 extending along a surface, in particular an X-Y plane, which comprises a surface structuring on a main surface side. In the centre of the illustration in FIG. 4B a carrier foil 3 is shown, one main surface of which can be positioned on the main surface of the base substrate 1 comprising the surface structuring, and on the other main surface of which components, for example bars B, can be positioned and fixed. FIG. 4B also shows a fixing frame 5 which fixes the carrier foil 3 positioned on the main surface of the base substrate 1 comprising the surface structuring to the base substrate 1.

The core idea of such a foil pack, which can likewise be referred to as a tape pack, is a carrier foil 3 such as an adhesive foil or a foil with adhesive edges. Accordingly, a conventional gel and an underlying conventional nylon grid or mesh can be dispensed with. The foil or carrier foil 3 can be clamped into or onto the base carrier 1 by means of a ring, a clamp or, more generally, by means of a fixing frame 5. For example, a conventional foil can be used, such as an adhesive foil ATR-MF120.

The base carrier 1 can be manufactured, for example, by injection molding and with elongated recesses 11 optimized for the removal of bars B, for example in the form of grooves or riffles. Such grooves or riffles are an example of a surface structuring of a main surface side of a base carrier 1. The grooves or riffles or recesses 11 enable a carrier foil 3 to be easily and effectively inserted into a groove or riffles under negative pressure or vacuum. In this way, a contact surface of an bar B on a carrier foil 3 is effectively reduced, whereby the adhesive force is reduced in such a way that the components or bars B can be removed from the carrier foil 3 without great force. It should be possible to lay down bars B transversely, for example at an angle of more than 40 degrees, to the elongated recesses 11. If bars B are generally oriented along the X- or Y-axis of the base carrier 1, an orientation of the elongated recesses 11 at an angle of 45 degrees to the X-axis is suitable for these two orientations of the bars B.

As a result of a strong spread of conventional gel packs in the semiconductor industry, the base carrier 1 should correspond as far as possible to the dimensions of a conventional gel pack. The dimensions of the base carrier are standardized for all packs with and without vacuum environment in the semiconductor industry.

The tape packs according to the invention also differ from conventional gel packs in height. It is estimated that tape packs according to the invention are about 1 mm higher than conventional gel packs. However, such a height difference can be compensated for by appropriate system settings.

FIG. 4B shows side by side a base carrier 1 with elongated recesses 11, for example riffles, which can be produced as an injection molded part. A further individual part is a carrier foil 3, which can be designed as an adhesive foil or generally as a foil. The carrier foil 3 may have an adhesive on at least one main surface. Another individual part is a fixing frame 5, which may be provided as a ring or clamp, for example with slightly conical self-locking formations. The fixing frame 5 may, for example, have been manufactured as an injection-molded part.

Figure 4C:
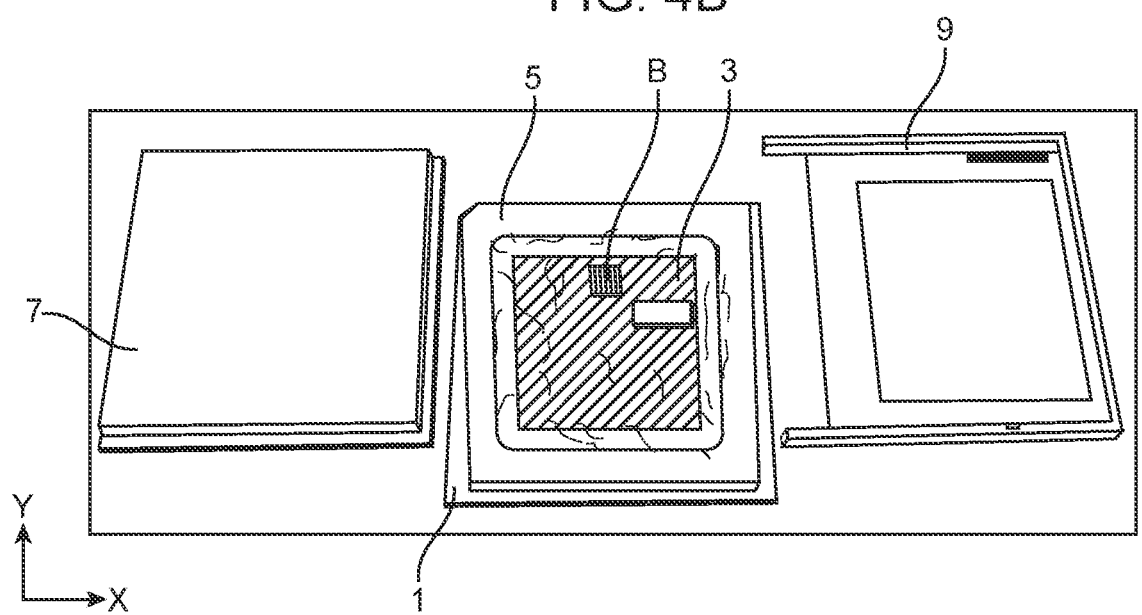
FIG. 4C shows a further illustration of a device according to the invention with individual parts separated from each another.

FIG. 4C shows a further illustration of a device according to the invention, namely with further individual parts separated from each other. FIG. 4C shows a cover with reference sign 7. This can be designed as an injection molded part. A cover 7 can, for example, close off the carrier foil 3, which is fixed to the base carrier 1 by means of a fixing frame 5, from the side of the fixing frame 5.

In FIG. 4C, reference sign 9 designates a closure. A closure 9 can cover or close off the carrier foil 3 fixed to the base carrier 1 by means of the fixing frame 5 from the side of the base carrier 1. In the center of FIG. 4C, a stack consisting of a base carrier 1, a carrier foil 3 and a fixing frame 5 is shown. On top of this are bars B oriented in the X or Y direction. A closure 9 can be engaged with a cover 7 in such a way that the cover 7, together with the closure 9, completely encloses or wraps around the carrier foil 3, which is fixed to the base substrate 1 by means of the fixing frame 5, and mechanically fixes it.

Figure 5A:
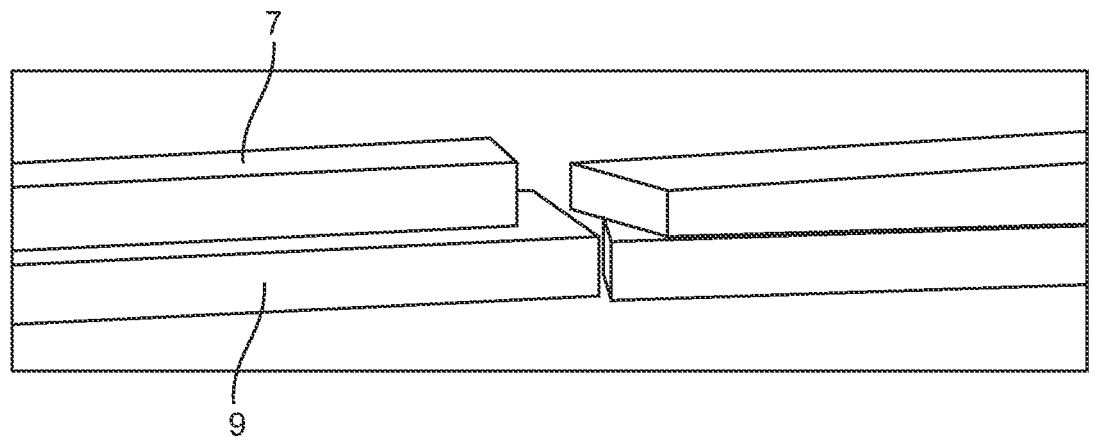
FIG. 5A shows a side view of a device according to the invention next to a conventional device.

FIG. 5A shows a side view of a device according to the invention next to a conventional device. The device according to the invention, which can also be referred to here as a tape pack, can be approximately 1 mm taller in its overall height than conventional gel packs due to the fixing frame 5 acting as a clamp for clamping the carrier foil 3 and the material rigidity required as a result.

FIG. 5A shows the difference in size between a device according to the invention and a conventional device, which is shown on the right in FIG. 5A. In FIG. 5A, cover 7 and closure 9 enclose base carrier 1, carrier foil 3 and fixing frame 5.

Figure 5B:
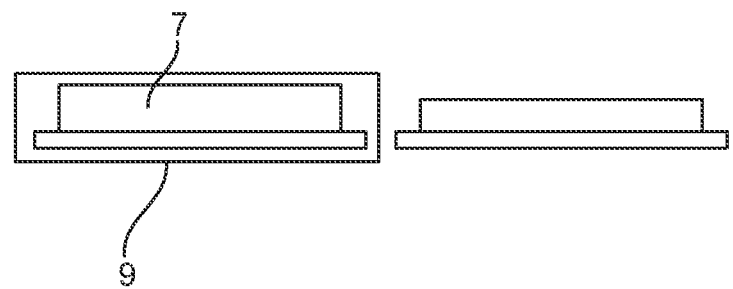
FIG. 5B shows a cross-section of a device according to the invention next to a conventional device.

FIG. 5B shows a cross-section of a device according to the invention in addition to a conventional device as shown in FIG. 5A. FIGS. 5A and 5B show a possible height difference between a device according to the invention and a conventional device.

Figure 6A:
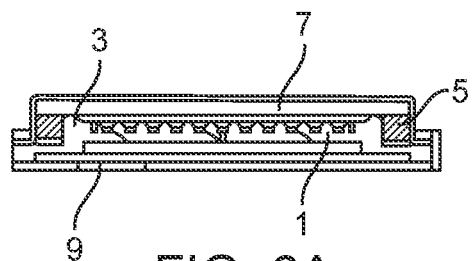
FIG. 6A shows a cross-section of a device according to the invention.
Figure 6B:
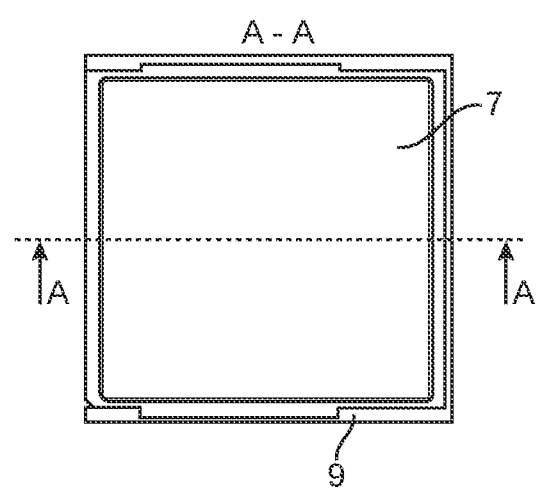
FIG. 6B shows a top view of a device according to the invention showing the sectional plane of FIG. 6A.

FIG. 6A shows a cross-section of a device according to the invention. The sectional plane corresponds to the plane A-A as shown in FIG. 6B. In the cross-section of FIG. 6A, the base carrier 1, the carrier foil 3 and the fixing frame 5 are visible. From above, a cover 7 is mechanically coupled to a lower closure 9 in such a way that, in addition, the three inner individual parts, base carrier 1, carrier foil 3 and fixing frame 5, are mechanically fixed and protected from external influences by means of cover 7 and closure 9. Semiconductor components, for example bars B, can be fixed, stored and protected on the carrier foil 3.

FIG. 6B shows a top view of a device according to the invention, wherein in FIG. 6B the cross-sectional plane of FIG. 6A is marked by the section line A-A. The view according to FIG. 6B shows a top view of the cover 7, which can be mechanically pushed into a guide rail of the closure 9.

FIGS. 6A and 6B show an example of a device according to the invention, which may be manufactured as an injection molded part.

Figure 7:
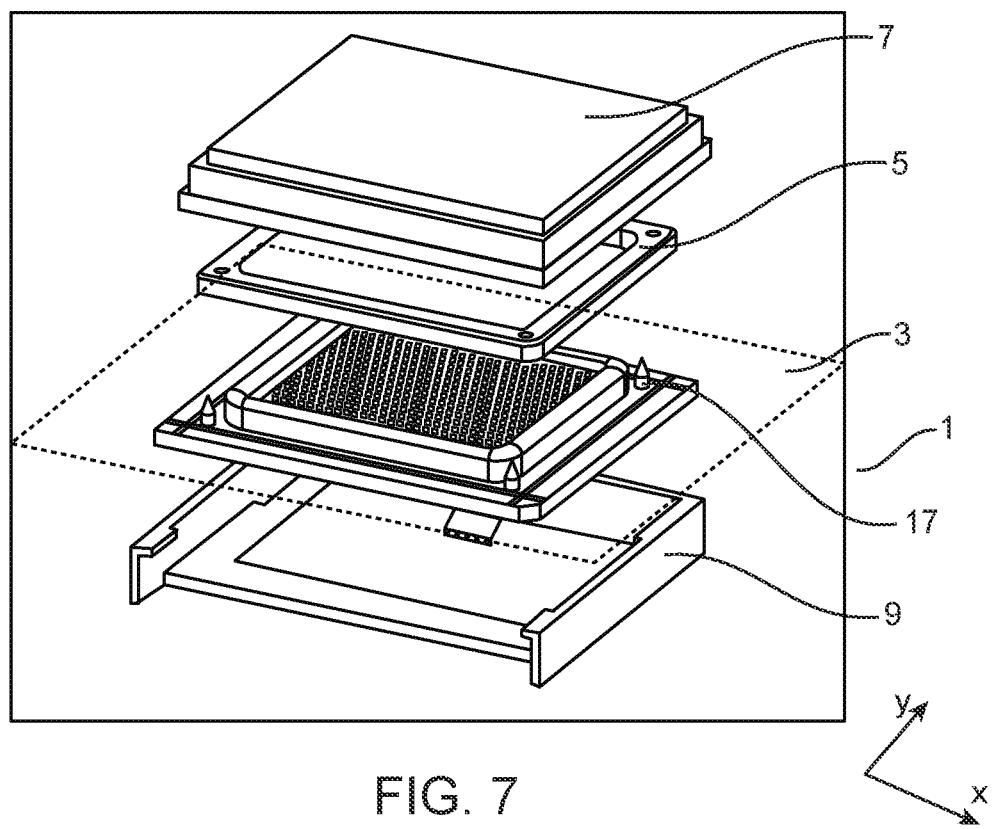
FIG. 7 shows an exploded view of a further example of a device according to the invention.

FIG. 7 shows an exploded view of a further example of a device according to the invention. A base carrier 1 with a carrier foil 3 and a fixing frame 5 are arranged between a cover 7 and a closure 9. Here the fixing frame 5 is designed as a foil clamp in the form of an outer ring. All individual parts may, for example, be made of a conductive polycarbonate material.

FIG. 7 also shows that a fixing frame 5 can additionally be positioned and fixed by means of securing pins 17 of the base carrier 1. Furthermore, the individual parts of a device according to the invention may have been manufactured by means of a sintering process. Further manufacturing processes are made possible by a so-called 3D printer.

Figure 8:
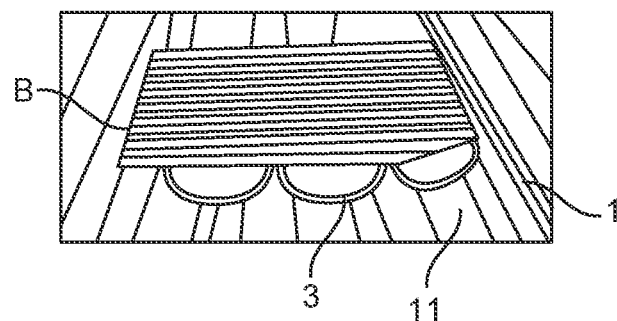
FIG. 8 shows a further illustration of a device according to the invention under vacuum.

FIG. 8 shows a further illustration of a device according to the invention, in this case under the effect of a vacuum. Longitudinal recesses 11 are produced here as grooves with round cross-section lines. Bars B project beyond the grooves provided, with one bar covering three grooves, for example. The bars are oriented at right angles to the grooves. A carrier foil 3 is arranged between the surface-structured base substrate 1 and the bar B and is attracted towards the base substrate 1 under the influence of vacuum or vacuum pressure. In this way, there is only contact between bar B and carrier foil 3 and the open ends of the grooves. In the state shown in FIG. 8, bars B can easily be lifted off. The carrier foil 3 is sucked into the riffles as shown in FIG. 8. This reduces the contact area of the component B on the carrier foil 3. The bars B can be removed from the foil in a simple manner, for example by means of vacuum tweezers. To prevent the bars B from falling into the grooves, the positioning of the bars B is such that they have been arranged in their longitudinal direction transverse to the direction of the grooves. FIG. 8 shows a so-called groove shaft with bars B under vacuum influence.

For example, an adhesive foil ATR-MF 120 can be used as carrier foil 3. The use of the type of carrier foil is not limited to this. Semiconductor components can, for example, be placed on an adhesive foil and removed again while reducing the contact area of the foil. If the component B is placed over the entire surface of the adhesive foil, it is not possible for the semiconductors to slip or fall off. Any type of carrier foil for semiconductor production can also be used as a foil.

Figure 9A:
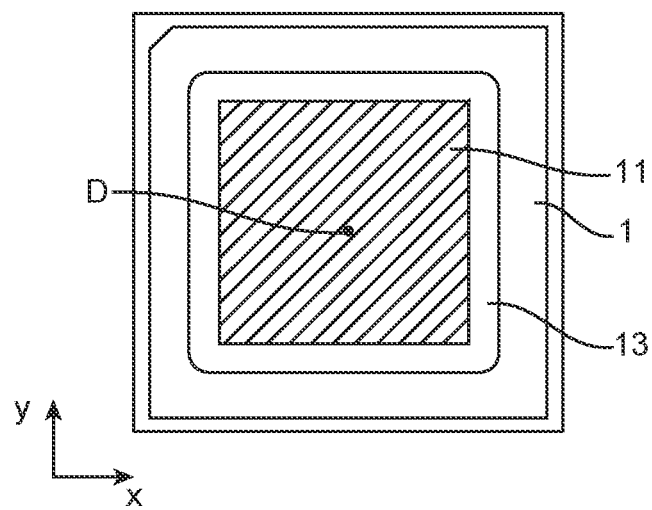
FIG. 9A shows a further illustration of a base carrier according to the invention.

FIG. 9A shows a further illustration of a base carrier 1 according to the invention. Here, the base carrier 1 comprises riffles 11 as longitudinal recesses. In contrast to grooves, riffles can have angular cross-sectional lines. The base carrier 1 can be manufactured by injection molding with defined riffles. The riffles can be offset or rotated 45° to the X axis. In addition, the recesses 11 or riffles can comprise regular interruptions 15 at their open wall ends or tips. These interruptions 15 reduce mechanical stresses on the carrier foil 3 under vacuum or negative pressure. Furthermore, the interruptions 15 can be used to further reduce the contact area of the bars B.

To provide negative pressure or a vacuum between the carrier foil 3 and the base carrier 1, the base carrier 1 can comprise passages. Such a passage D or via is visible, for example, in the center of the base carrier 1. For example, a base carrier 1 can be milled from aluminium. In particular, a design of the base carrier 1 as an aluminium part is suitable, whereby adhesion foils can be used with the base carrier 1 consisting of aluminium.

Figure 9B:
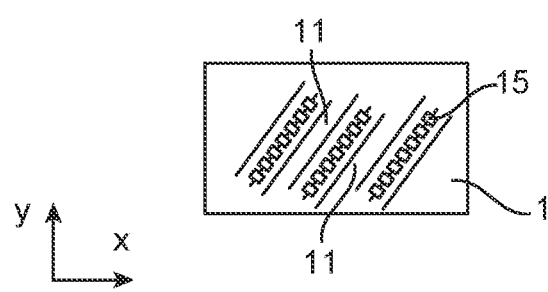
FIG. 9B shows a further illustration of a surface structure of a base carrier according to the invention.

FIG. 9B shows a more detailed illustration of a surface structure of a base carrier 1 according to the invention. In this case, elongated recesses 11 are formed which have regular interruptions 15, in this case square cutouts, at their open wall ends, which in particular here can be formed in cross-section as tips. The interruptions 15 can also be rectangular or rounded. FIG. 9B shows the orientation of the elongated recesses 11 or riffles, which extend slanted and, for example, rotated through an angle of 40 to 50° with respect to an X axis. The example shows a 45° angle. FIG. 9B shows a cutaway view of the open ends of three walls forming two elongated recesses 11.

Figure 9C:
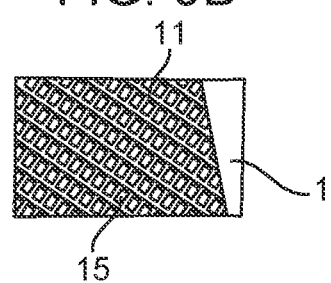
FIG. 9C shows a further illustration of a surface structure of a base carrier according to the invention.

FIG. 9C shows a further detailed illustration of a surface structuring of a base carrier 1 according to the invention. The elongated recesses 11 here are riffles. To prevent bars B from falling into the riffles, it is necessary to select a mutually crossing orientation. The riffles here also have regular interruptions 15. FIG. 9C shows the orientation of the riffles, which extend slanted and rotated, for example, by an angle of 130 to 140° to an X axis. The angle shown here is 135°.

The detailed view of FIG. 9C shows that recesses 11 can be created at their open wall ends with regular interruptions 15.

Figure 9D:
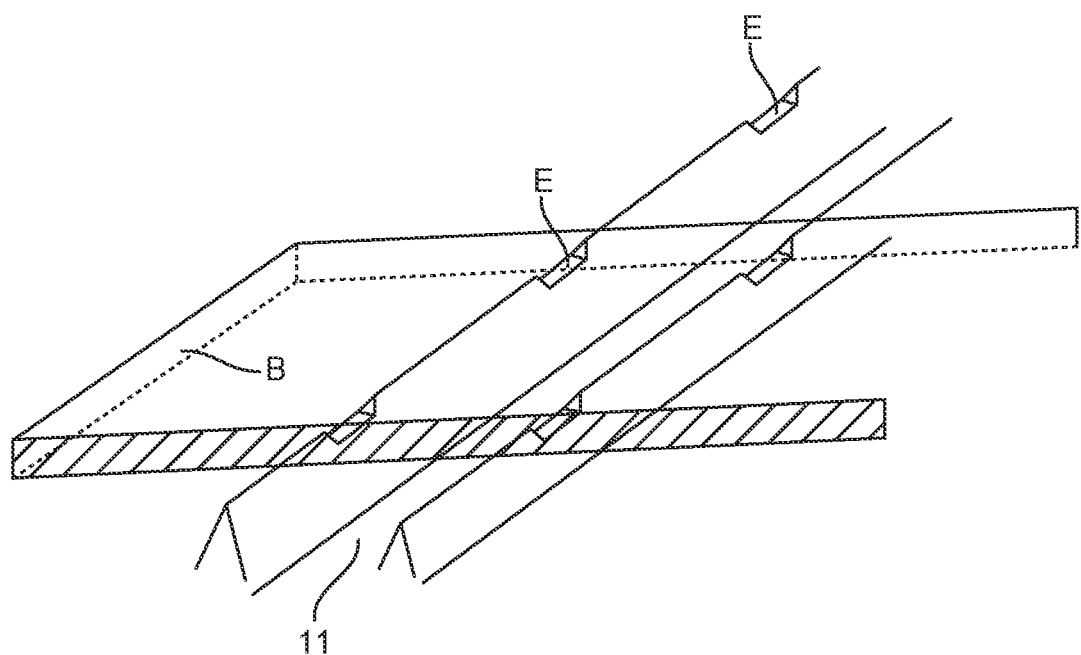
FIG. 9D shows a further illustration of a surface structure of a base carrier according to the invention.

FIG. 9D shows a further illustration of a surface structure of a base carrier according to the invention. A bar B lies transverse to an elongated recess 11 of a riffle which here comprises angular lines in its cross-section. The open ends of the walls providing the recess 11 run pointedly in the direction of the respective open end. These ends also have indentations E or, according to FIG. 9B, regular interruptions of a respective upper boundary line. These interruptions or indentations E have a square or rectangular shape when viewed from above. In contrast to FIG. 9B, the distances between the regular interruptions or indentations are larger.

Figure 10A:
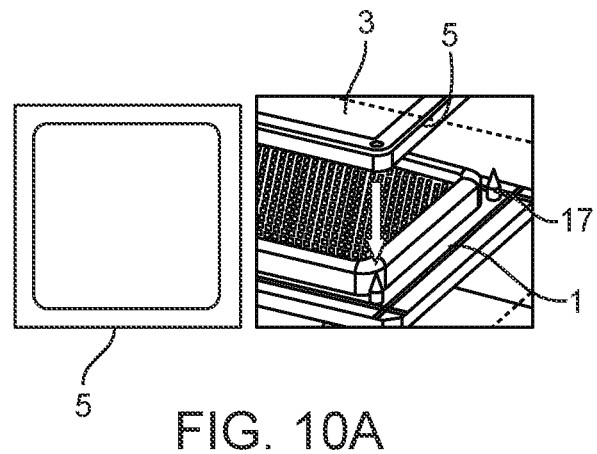
FIG. 10A shows a further illustration of a fixing frame according to the invention.
Figure 10B:
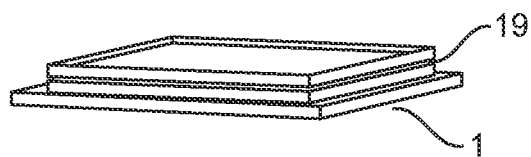
FIG. 10B a further illustration of a base carrier according to the invention.
Figure 10C:
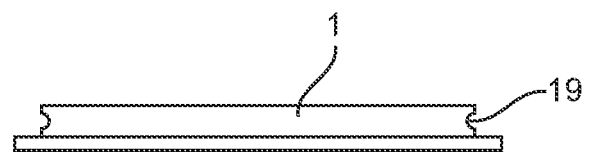
FIG. 10C shows a further illustration of a base carrier according to the invention.
Figure 10D:
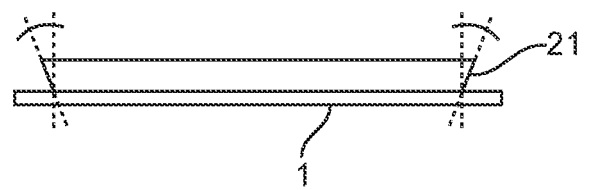
FIG. 10D shows a further illustration of a base carrier according to the invention.

FIG. 10A shows a further illustration of a fixing frame 5 according to the invention. The fixing frame 5 can be designed as a clamp. By means of the fixing frame 5 designed as a clamp, the carrier foil 3 can be clamped and secured on the base carrier 1. In this case, the fixing frame 5 acts as a clamp via a groove on the base carrier 1, this is shown with reference to FIG. 10B and FIG. 10C. The fixing frame 5 can alternatively be fixed to the base carrier 1 by conical design of the flanges 21, this being shown with reference to FIG. 10D. In addition, locking pins 17 can be provided at the corners of the base carrier 1, into which the fixing frame 3 can also be positioned and fixed. The latter is shown in FIG. 10A on the right-hand side.

Accordingly, FIGS. 10A, 10B, 10C and 10D show how a fixing frame 5 can be detachably fixed to a base carrier 1. The fixing frame 5, which is designed as a clamp, can be released or opened again so that a foil change is possible. Thus, a base carrier 1 can be cleaned and reused.

Figure 11A:
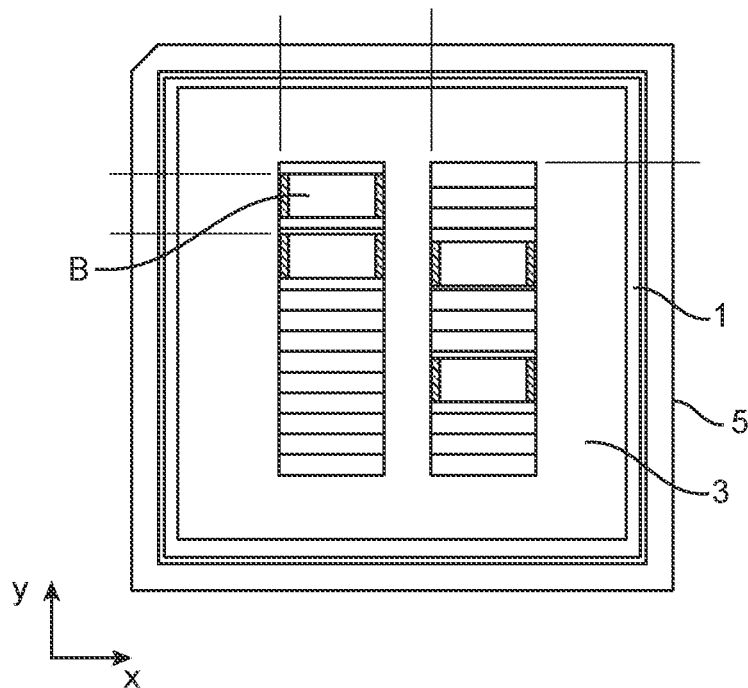
FIG. 11A shows a further illustration showing the use of a device according to the invention.

FIG. 11A shows a further illustration of the use of a device according to the invention. FIG. 11A shows how semiconductor components, in particular bars B, can be placed on a used carrier foil 3. The bars B are oriented here along an X-direction. The bars B can be placed on target markers, in particular target rectangles, oriented accordingly along the X-direction. These can be applied to a respective carrier foil 3 or a base carrier 1.

Figure 11B:
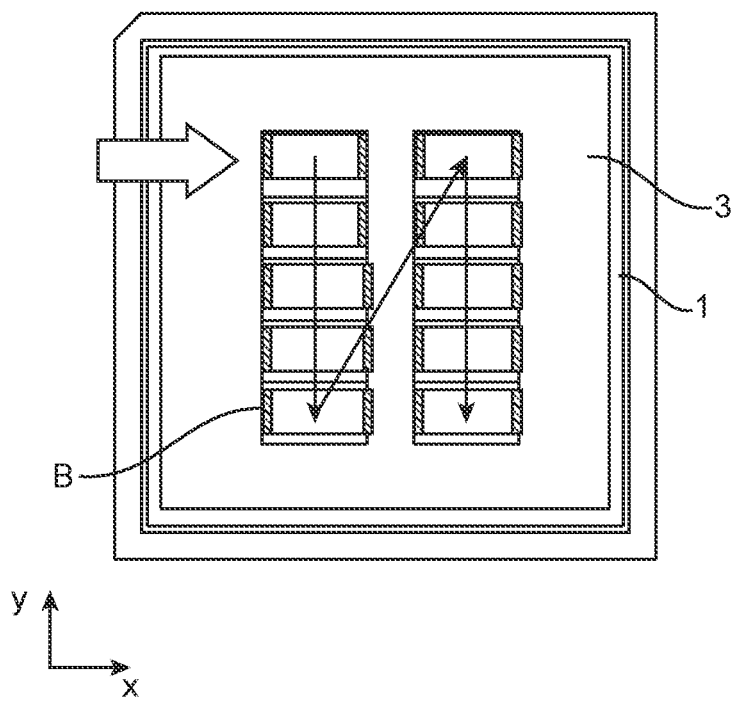
FIG. 11B shows a further illustration showing the use of a device according to the invention.
Figure 12A:
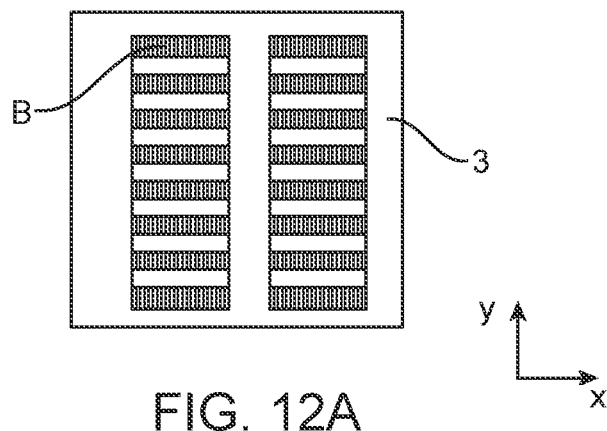
FIG. 12A shows a further illustration showing the use of a device according to the invention.
Figure 12B:
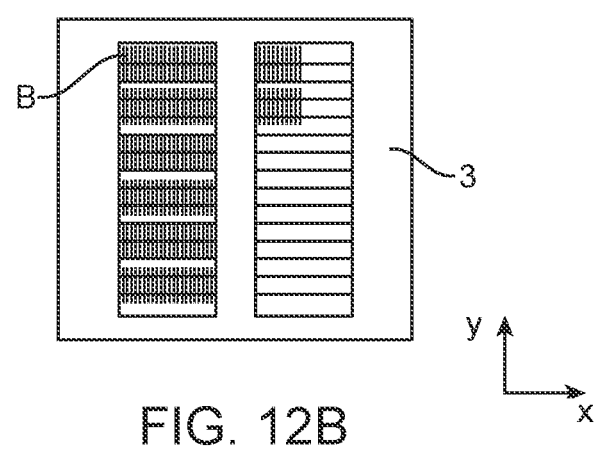
FIG. 12B shows a further illustration showing the use of a device according to the invention.
Figure 12C:
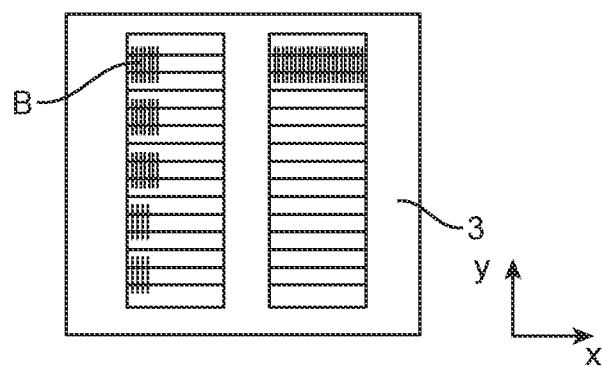
FIG. 12C shows a further illustration showing the use of a device according to the invention.

FIG. 11B shows, in addition to FIG. 11A, a placement sequence of bars B on the target rectangles of a carrier foil 3 or a base carrier 1. First a left target rectangle column and then a right target rectangle column are loaded with bars B, in each case from top to bottom.

In addition to the illustrations in FIGS. 11A and 11B, FIGS. 12A, 12B and 12C show further placement of bars B on a respective carrier foil 3 or a respective base carrier 1. There are preferred placement locations and placement sequences. In addition, conventional placement patterns can be used. The bars B are oriented here along a Y-direction and arranged perpendicular to target rectangles.

Figure 13:
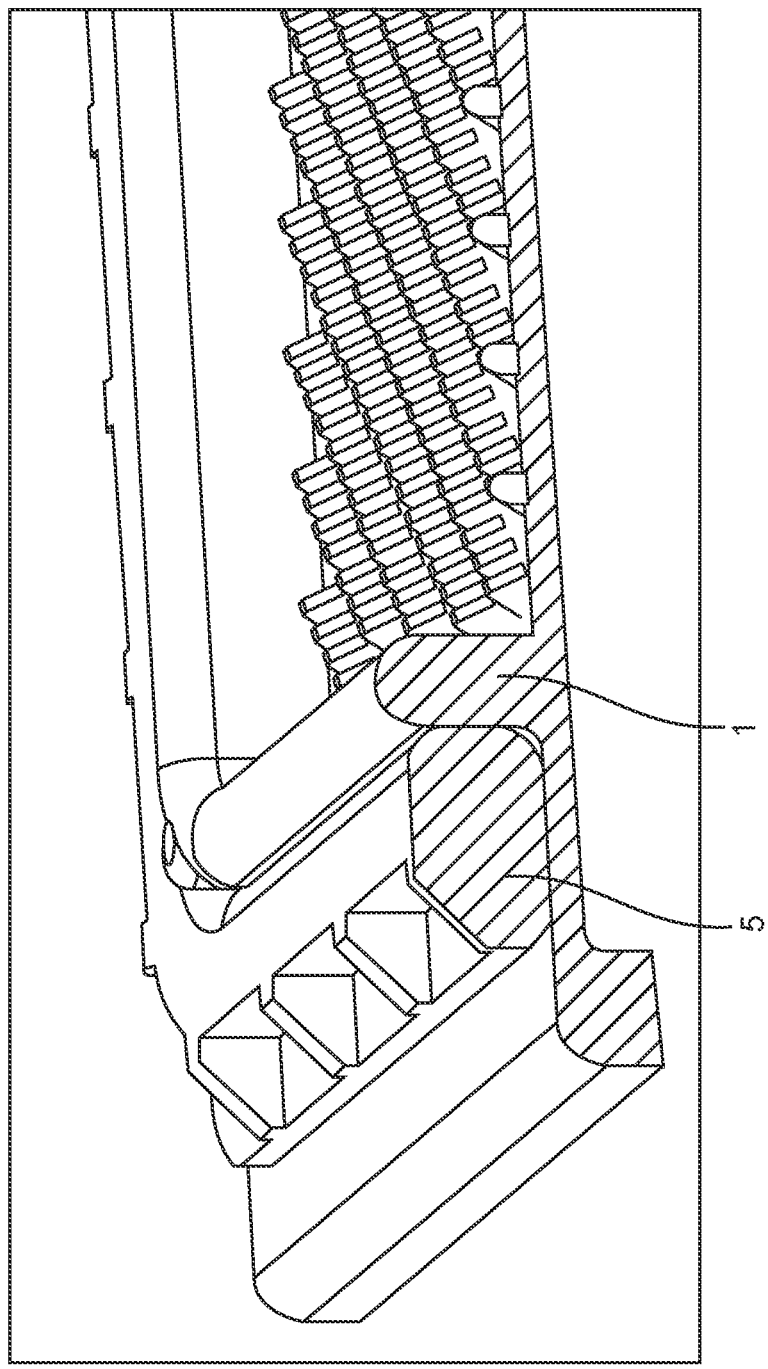
FIG. 13 shows a further illustration of a base carrier according to the invention.

FIG. 13 shows a further illustration of a base carrier 1 according to the invention. FIG. 13 clearly shows the surface structuring of the base carrier 1. A fixing frame 5 is clamped onto the frame of the base carrier 1. For further clarity, this arrangement is also shown as a cross-section.

Figure 14:
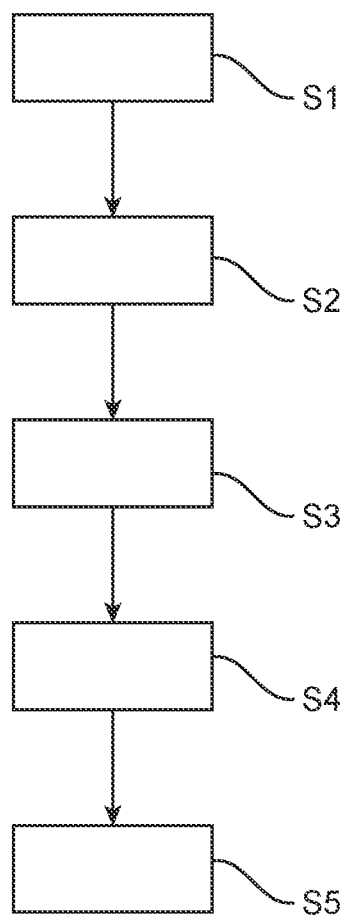
FIG. 14 shows a further illustration showing the use of a device according to the invention.

FIG. 14 shows a further illustration of the use of a device according to the invention. According to a possible use of a storage device according to the invention, the following example is described. In a first step S1, semiconductor components are deposited and fixed on the carrier foil, in particular by means of adhesion and/or by means of adhesive. In a next step S2, the component-carrying carrier foil is fixed or clamped to the base carrier 1 by means of a fixing frame. This is followed by a third step S3, in which, after fixing the component- and bar B-carrying carrier foil to the base carrier by means of the fixing frame, a complete wrapping is carried out by means of the cover and the closure.

After the storage time, a removal of the cover and closure can be carried out in a fourth step S4. With a final step S5, a removal of the components or bars B from the carrier foil carried by the base carrier can be carried out by applying a vacuum or negative pressure to the carrier foil carried by the base carrier.

The present invention includes several advantages. For example, replacement of a carrier foil 3 and multiple use of the base carrier 1, the carrier foil 3 and the fixing frame 5 are possible due to the clamp. In this way, multiple use of the so-called tape pack is possible.

Another advantage is the possibility to use different carrier foils. This results in low production costs for the carrier foils. The carrier foils 3 can be evaluated and used individually for each component. The base substrate 1 with the elongated recesses 11 can, for example, be manufactured in a casting process. This makes it possible to dispense with the insertion of a nylon grid. Furthermore, no special gel film needs to be used as the carrier foil 3.

Another advantage is the resistance of the carrier foil 3 to a gel. Due to its thickness, a carrier foil 3 is significantly more tear-resistant than a gel. Thus, the packs are less susceptible.

Furthermore, production effort and costs can be reduced. Due to the low manufacturing effort, the packs can be produced in high quantities at a lower price.

Furthermore, the proposed corrugated design is advantageous. Insertion of the carrier foil 3 and thus sufficient reduction of the contact points of the bars B is only possible in the elongated recesses 11. Since the carrier foil 3 used is thicker than a conventional gel, with conventional nylon grids and domes the foil would not be sufficiently inserted and would adhere to the component B. The foil is therefore not sufficiently thick.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. A storage device for components, the storage device comprising:
   a base carrier extending along a main surface comprising a surface structuring;
   a carrier foil comprising a first main surface and a second main surface, wherein the first main surface is fixable to or arrangeable on the main surface of the base carrier, and wherein the components are fixable to the second main surface; and
   a fixing frame releasably fixing the carrier foil to the base carrier and acting as a releasable clamp so that the carrier foil is clamped and secured in or to the base carrier and so that the carrier foil is fixed to or positioned on the main surface of the base carrier.

2. The storage device according to claim 1, further comprising a cover extending along the main surface and closing off the carrier foil fixed to the base carrier from a side of the carrier foil.

3. The storage device according to claim 2, further comprising a closure extending along the main surface and closing off the carrier foil fixed to the base carrier from a side of the base carrier.

4. The storage device according to claim 3, wherein the cover and the closure extend along the main surface beyond the carrier foil fixed to the base carrier, and optionally beyond the fixing frame.

5. The storage device according to claim 4, wherein the base carrier, the carrier foil, the fixing frame, the cover and the closure are manufactured of conductive polycarbonate material.

6. The storage device according to claim 4, wherein the base carrier, the carrier foil, the fixing frame, the cover and the closure are manufactured by sintering and/or 3D printing or injection molding.

7. The storage device according to claim 3, wherein, in a closed state, the cover together with the closure completely encloses the carrier foil, which is fixed to the base carrier by the fixing frame.

8. The storage device according to claim 1, wherein the surface structuring of the base carrier comprises elongated recesses configured to remove the components.

9. The storage device according to claim 8, wherein the elongated recesses comprise regular interruptions or passages configured to provide negative pressure or a vacuum between the carrier foil and the base carrier.

10. The storage device according to claim 8, wherein the base carrier is manufactured by an injection molding process.

11. The storage device according to claim 1, wherein the main surface of the base carrier comprises a rectangular or square surrounding wall.

12. The storage device according to claim 1, wherein the carrier foil is an adhesive foil and/or comprises at least one adhesive on at least one of the main surfaces.

13. The storage device according to claim 1, wherein the carrier foil comprises a material rigidity and/or thickness such that it is not destroyed during fixing to the base carrier by the fixing frame.

14. The storage device according to claim 1, wherein the fixing frame is clampable to the base carrier by a groove formed at the base carrier.

15. The storage device according to claim 1, wherein the fixing frame is clampable to the base carrier by conically formed flanks at the base carrier.

16. The storage device according to claim 1, wherein the fixing frame is clampable to the base carrier by securing pins formed at the base carrier.

\* \* \* \* \*